United States Patent
Chen et al.

(10) Patent No.: US 10,468,010 B2
(45) Date of Patent: Nov. 5, 2019

(54) ACOUSTICAL ATTENUATOR IN STORAGE ARRAY TO IMPROVE PERFORMANCE

(71) Applicant: QUANTA COMPUTER INC., Taoyuan (TW)

(72) Inventors: Chao-Jung Chen, Taoyuan (TW); Yu-Nien Huang, Taoyuan (TW); Ching-Yu Chen, Taoyuan (TW); Liang-Yu Wu, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 219 days.

(21) Appl. No.: 15/590,673

(22) Filed: May 9, 2017

(65) Prior Publication Data

US 2018/0330712 A1 Nov. 15, 2018

(51) Int. Cl.
*G10K 11/22* (2006.01)
*G11B 33/08* (2006.01)
(Continued)

(52) U.S. Cl.
CPC .......... *G10K 11/22* (2013.01); *F16L 55/0331* (2013.01); *G11B 33/08* (2013.01); *G11B 33/128* (2013.01); *G11B 33/142* (2013.01); *H05K 7/20718* (2013.01); *H05K 7/20918* (2013.01); *F16L 55/033* (2013.01); *G10K 11/16* (2013.01); *G10K 11/178* (2013.01); *G10K 11/18* (2013.01); *G10K 2210/11* (2013.01);
(Continued)

(58) Field of Classification Search
CPC ..... G11B 33/08; G11B 33/128; G11B 33/142; H05K 7/20736; H05K 7/20718; H05K 7/20918; G10K 11/22; G10K 11/18; G10K 11/16; G10K 2210/3224; G10K 2210/507

USPC .................................................. 181/224, 225
See application file for complete search history.

(56) References Cited

U.S. PATENT DOCUMENTS 5,426,268 A  6/1995 Yazici et al.
7,283,358 B2 * 10/2007 Campbell ............... F24F 13/04
                                                361/694
(Continued)

FOREIGN PATENT DOCUMENTS

DE      3544022 A1    6/1987
JP      S62-101287 U  6/1987
(Continued)

OTHER PUBLICATIONS

JP Office Action for Application No. 2017-196364, dated Nov. 6, 2018, w/ First Office Action Summary.
(Continued)

*Primary Examiner* — Jeremy A Luks
(74) *Attorney, Agent, or Firm* — Nixon Peabody LLP; Zhou Lu

(57) ABSTRACT

An apparatus is provided. The apparatus includes a plurality of flow guiding structures spatially aligned in a first row, each of the plurality of flow guiding structures comprising a fin-shape to funnel airflow at a trailing edge of each of the plurality of flow guiding structures. The apparatus also includes a plurality of flow separating structures spatially aligned in a second row interleaved between each of the plurality of flow guiding structures, each of the plurality of flow separating structures comprising a fin-shape configured to split airflow received from the plurality of flow guiding structures.

20 Claims, 9 Drawing Sheets

(51) Int. Cl.
*G11B 33/12* (2006.01)
*G11B 33/14* (2006.01)
*H05K 7/20* (2006.01)
*G10K 11/16* (2006.01)
*G10K 11/18* (2006.01)
*F16L 55/033* (2006.01)
*G10K 11/178* (2006.01)

(52) U.S. Cl.
CPC ............... *G10K 2210/3224* (2013.01); *G10K 2210/507* (2013.01); *H05K 7/2089* (2013.01)

(56) References Cited

U.S. PATENT DOCUMENTS

| | | | |
|---|---|---|---|
| 7,369,406 | B2 | 5/2008 | Matsushima et al. |
| 7,712,576 | B2 * | 5/2010 | Goto ................ G06F 1/182 |
| | | | 181/200 |
| 7,872,865 | B2 * | 1/2011 | Matsushima ........ G11B 33/142 |
| | | | 165/104.33 |
| 8,579,074 | B2 | 11/2013 | Kosaka et al. |
| 8,701,821 | B2 * | 4/2014 | O'Coimin .......... H05K 7/20736 |
| | | | 181/224 |
| D803,223 | S * | 11/2017 | LaPree ..................... D14/441 |
| 10,073,502 | B2 * | 9/2018 | Petruzzo ............. G11B 33/128 |
| 2002/0115406 | A1 | 8/2002 | Ruach |
| 2003/0221904 | A1 | 12/2003 | Ludwig et al. |
| 2008/0007912 | A1 | 1/2008 | Matsushima et al. |
| 2009/0201640 | A1 * | 8/2009 | Bard .................. H05K 7/20181 |
| | | | 361/694 |
| 2017/0172014 | A1 | 6/2017 | LaPree et al. |
| 2018/0063999 | A1 * | 3/2018 | Matsuyama ........... G01K 1/024 |
| 2018/0073432 | A1 * | 3/2018 | Ponyavin ................ F02C 7/045 |

FOREIGN PATENT DOCUMENTS

| | | |
|---|---|---|
| JP | H04-85785 U | 7/1992 |
| JP | H07218174 A | 8/1995 |
| JP | S52-152930 U | 11/1997 |
| JP | 2007035173 A | 2/2007 |
| JP | 2008235381 A | 10/2008 |

OTHER PUBLICATIONS

Extended European Search Report for EP Application No. 17188838.1, dated May 4, 2018.
Taiwanese Office Action for Application No. 106121829, dated Jan. 2, 2018, w/ First Office Action Summary.
Taiwanese Search Report for Application No. 106121829, (report conducted Dec. 27, 2017) dated with First Office Action dated Jan. 2, 2018.
JP Office Action for Application No. 2017-196364, dated Jun. 18, 2019, w/ Second Office Action Summary.

* cited by examiner

HDD R/W perf, %

Airflow SPL @ HDD

Fan Noise, SPL

ACOUSTICAL ATTENUATOR IN STORAGE ARRAY TO IMPROVE PERFORMANCE

FIELD OF THE INVENTION

The present invention relates to apparatuses for suppressing noise emanating from individual electronic units within a server device.

BACKGROUND

The operating of a server system produces unnecessary heat. If the unnecessary heat produced during the operation of the server system is not removed, the efficiency of the server system will be lowered, and in turn the server system will be damaged. Typically, a fan is installed in the server system to dissipate heat and cool the server system.

With the increasing of the operating speed of the server system, the heat produced during the operation of the server system is greatly increased. A high-speed fan is introduced to remove the unnecessary heat produced by the server system. However, noise made by the high-speed fan is louder than that of a typical fan. In light of these reasons, the optimization design for noise reducing and heat dissipating of the computer system is imperative.

One method of enhancing heat dissipation efficiency is to increase or accelerate airflow through the server system. However, the stronger the airflow is the more turbulent and noisy the wake flow may be. Thus, a server system manufacturer faces a challenge between noise and heat dissipation efficiency.

SUMMARY

Embodiments of the invention concern an apparatus for reducing hard drive disk airflow. The apparatus according to the various embodiments can include a plurality of flow guiding structures. The flow guiding structures can be spatially aligned in a first row. Furthermore, each of the plurality of flow guiding structures can include a fin with a trailing edge. The shape of each of the plurality of flow guiding structures can funnel the hard drive disk airflow at the trailing edge. Furthermore, the apparatus can include a plurality of flow separating structures. The plurality of flow separating structures can be spatially aligned in a second row. Furthermore, each of the plurality of flow separating structures can be interleaved between each of the plurality of flow guiding structures. Moreover, each of the plurality of flow separating structures can be a fin. The fin of each of the plurality of flow separating structures can be configured to split the airflow received from the plurality of flow guiding structures.

In some embodiments of the invention, each of the plurality of flow separating structures can include a supporting rod encased by sound absorber material. Similarly, in some embodiments of the invention, each of the plurality of flow guiding structures can include a supporting rod encased by sound absorber material. Furthermore, in some embodiments of the invention, the fin of each of the plurality of flow separating structures can include a rounded leading edge and a sharp trailing edge. In some embodiments of the invention, the rounded leading edge comprises a supporting feature. In alternative embodiments of the invention, the trailing edge of each of the plurality of flow guiding structures can include a sharp trailing edge. In an alternative embodiment of the invention, the trailing edge of each of the plurality of flow guiding structures can include a rounded trailing edge.

Furthermore, in some embodiments of the invention, the plurality of flow guiding structures can be spatially aligned to coincide with a space between a plurality of storage arrays. Moreover, in some embodiments the plurality of flow separating structures can be spatially aligned with a space between a plurality of storage arrays.

Embodiments of the invention concern a computing device for reducing hard drive disk airflow. The computing device according to the various embodiments can include a housing having an inlet side, an outlet side, a first sidewall, and a second sidewall. In some embodiments, the first sidewall and the second sidewall can extend from the inlet side to the outlet side. The computing device can include at least one row of drive bays extending at least partially from the first sidewall to the second sidewall. In some embodiments of the invention, the at least one row drive bays can be configured to receive a plurality of hard disk drives. In some embodiments of the invention, the at least one row drive bays can be configured to provide a plurality of gaps between the plurality of hard disk drives.

In some embodiments of the invention, the computing device can include a plurality of flow guiding structures. In some embodiments of the invention, the plurality of flow guiding structures can be disposed between the at least one row of drive bays and the outlet side. In some embodiments of the invention, each of the plurality of flow guiding structures can be configured as a fin-shape with a trailing edge. In some embodiments of the invention, the fin can be configured to funnel airflow through the plurality of gaps between the plurality of hard disk drives to the trailing edge.

Furthermore, in some embodiments of the invention, the computing device can include a plurality of flow separating structures. In some embodiments of the invention, each of the plurality of flow separating structures can be interleaved between each of the plurality of flow guiding structures. Moreover, each of the plurality of flow separating structures can be a fin. The fin of each of the plurality of flow separating structures can be configured to split the airflow received from the plurality of flow guiding structures.

DETAILED DESCRIPTION

Figure 1:
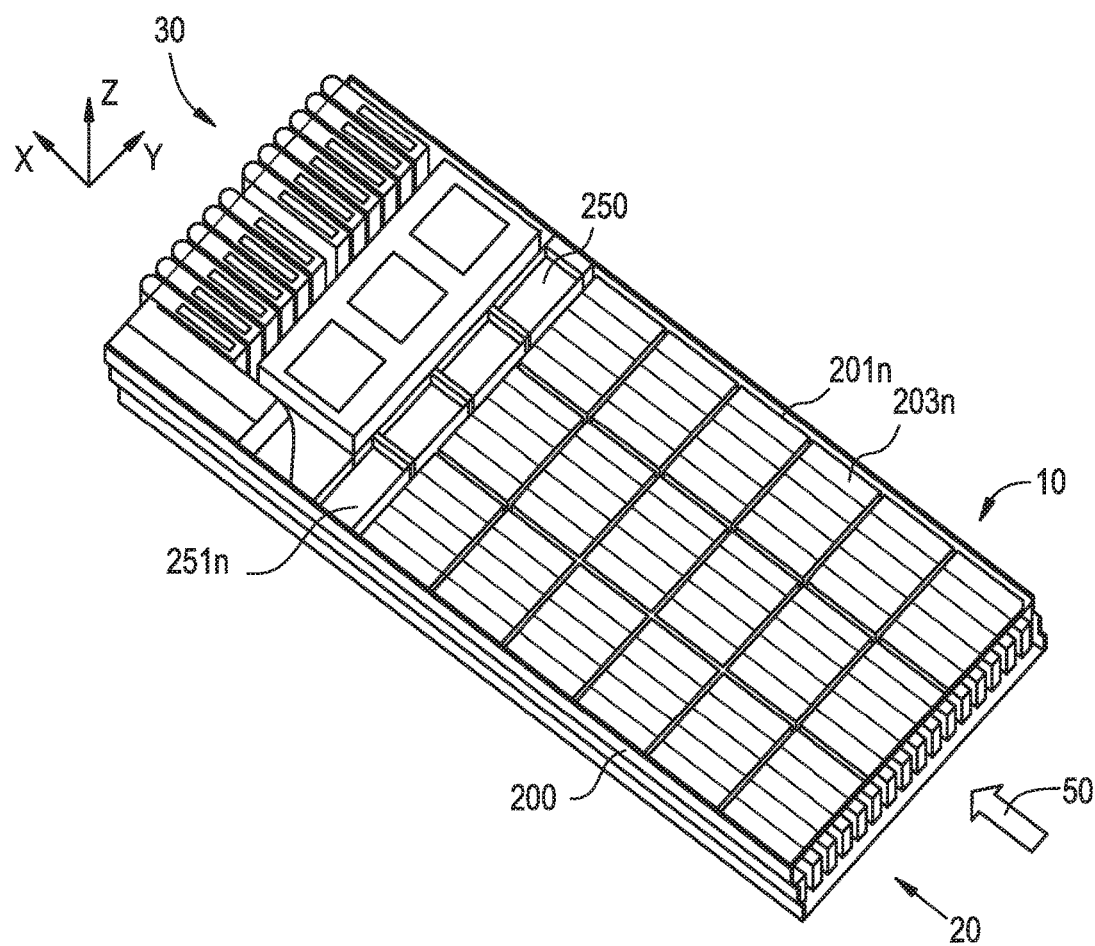
FIG. 1 is a top isometric view of a server device that includes hard drive disk airflow according to an embodiment.

The present invention is described with reference to the attached figures, wherein like reference numerals are used throughout the figures to designate similar or equivalent elements. The figures are not drawn to scale and they are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

As previous explained, it is common to introduce increased or accelerated airflow through the server system to remove the overwhelming heat produced by the server system. However, the stronger the airflow is the more turbulent and noisy the wake flow may be. This increased turbulence and noise can cause reduced HDD read/write performance. In order to resolve the issue of balance noise, heat dissipation efficiency and HDD read/write performance, preferred embodiments of the present invention provide an acoustic attenuator apparatus for hard drive disk airflow. In this disclosure, the acoustic attenuator apparatus will serve as an aerodynamic device with sound absorbing material to enhance hard disk drive performance by resolving the issue between noise, heat dissipation efficiency and HDD read/write performance. Specifically, the acoustic attenuator apparatus provides air flow guides so as to not disrupt the airflow while providing a sound barrier of the plurality of fan modules to the storage array module.

Figure 2:
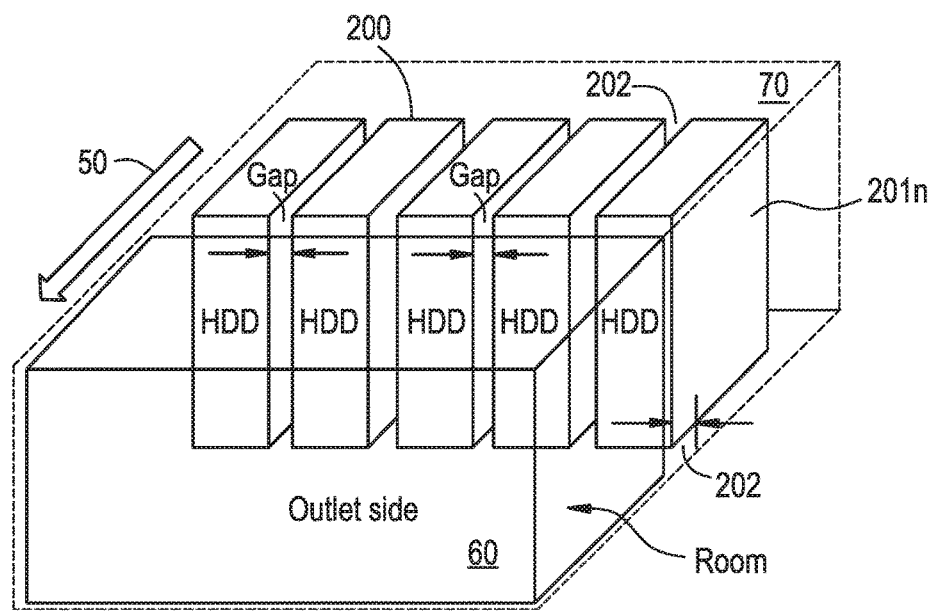
FIG. 2 is a front isometric view of the system that includes hard drive disk airflow according to an embodiment.

FIGS. 1 and 2 are top and front isometric views of a server device 10 exemplifying airflow 50 according to an embodiment. In some embodiments, the server device 10 includes a plurality of fan modules 250 and a storage array module 200. The server device can include a front end 20 and a rear end 30. The airflow 50 can come across the server device 10 and the encompassed storage array module 200 from the front end 20 to the rear end 30 via the plurality of fan modules 250. It should be realized that the server device 10 includes other components not mentioned herein. The components mentioned above are only for example, and not to limit this disclosure. The person having ordinary knowledge in the art may flexibly include other components in accordance to the invention.

In some embodiments, the storage array module 200 is disposed in the server device 10. To maximize storage, the storage array module 200 can include a plurality of storage arrays 201n closely stacked together. The space 202 between the plurality of storage arrays 201n is very small, to maximize the number of storage arrays 201n. In FIG. 1, the storage array module 200 can include eighteen storage arrays closely stacked together. Each of the storage arrays contains a plurality of disk devices 203n. The plurality of disk devices 203n can include hard disk drive, solid state disk drives, or a combination thereof. Furthermore, for the purpose of this invention, the plurality of disk devices 203n can include other drive technology not detailed herein. In FIG. 1, the plurality of disk devices can include ninety hard disk drives. It should be realized that the quantities of the storage arrays (e.g., eighteen) and disk devices (e.g., ninety) mentioned above are only for example, and not to limit this disclosure. The person having ordinary knowledge in the art may flexibly select any proper quantity of storage arrays according to the requirement.

The plurality of fan modules 250 in the server device 10 is arranged in parallel. In an embodiment of the invention, the plurality of fan modules 250 is disposed near the storage array module 200 to cool the storage array module 200 via convection. The plurality of fan modules 250 is utilized to enhance the air convection across the server device 10 from the front end 20 to the rear end 30. The plurality of fan modules 250 can include four high-powered computer device fans 251n. Thus, the airflow 50 generated by the fans 251n flows into and out of the server device 10 along an x-axis though the plurality of storage arrays 201n closely stacked together. Wake flow is generated by the blades of each of the plurality of fan modules 250 blowing on interior surfaces and other components of the server device 10. A blasting point is generated and regarded as a sound source that generates a band noise.

Consequently, for efficiency, the airflow flowing along the x-axis in the present embodiment is increased by increasing the rotational speeds of each of the plurality of fan modules 250 to effectively cool between the nominal spaces between the plurality of storage arrays 201n. This enables the plurality of fan modules 250 to maintain the storage array module 200 at the desired operating temperature. However, the more the rotational speed and the flow rate are increased, the higher the frequency of the noise band. Furthermore, each of the plurality of fan modules 250 is loud when operating. The noise comes from not only the fan itself but also the quantity of the magnetic poles, revolutions, blades of the fan, and combinations thereof. Therefore, the noise is increasing. It should be realized that the quantities of the fans (e.g., four) mentioned above are only for example, and not to limit this disclosure. The person having ordinary knowledge in the art may flexibly select any proper quantity of fans in accordance with the disclosure.

Referring now to FIG. 2. Air is drawn in from the inlet side 70 and exhausted towards the outlet side 60. In practice, the airflow 50 through the server device 10 is not laminar and a considerable amount of turbulence exists within the plenum of the outlet side 60. Because of the density of the storage array module 200, the air being blown through the space 202 collide in the outlet side 60, resulting in an increased air pressure and turbulence within the plenum. By following the equation of continuity, when air goes in a small gap, the air speed will be increased. As a result, as the airflow 50 passes through the storage array module 200 the air speed increases. When airflow 50 exits the storage array module 200 into the plenum of the outlet side 60, the airflow 50 speed is decreased. The airflow 50 becomes turbulent flow. The turbulent flow combined with the noise emanating from the plurality of fan modules 250 causes the HDD performance of reading/writing data to perform poorly.

Figure 10:
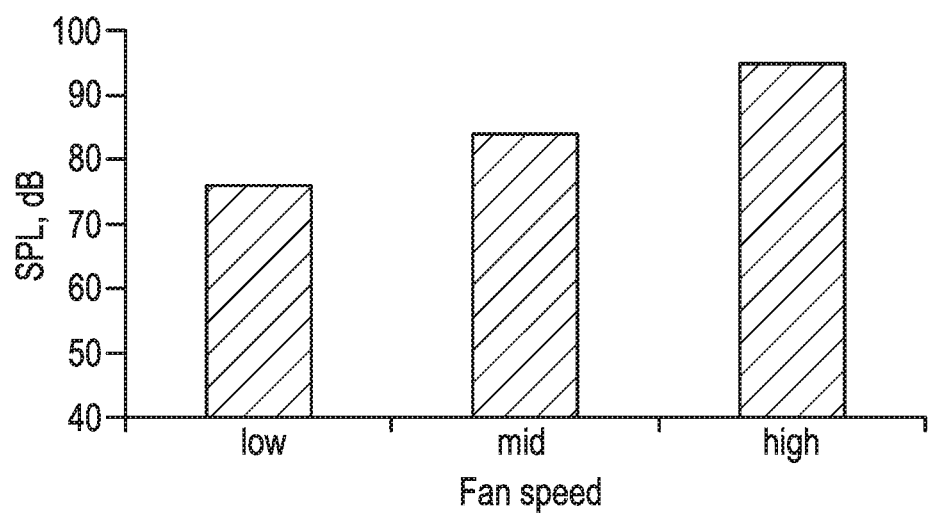
FIG. 10 is a chart exemplifying the fan noise at varying fan speeds according to an embodiment.

When the airflow 50 is turbulent, the Reynolds number is much higher, thus the flow speed is also high. In the field of acoustics, when a high speed air flow blows over a narrow gap, it will cause a high pitch noise and cause high sound pressure level (SPL) around the storage array module 200. Referring to FIG. 10 momentarily, the higher the fan speed the more high SPL noise is generated around the storage array module 200. When the frequency range of the high SPL noise is coupled with the hard disk drive head nature frequency, the hard disk drive head will not stay in position, thus causing a reduction in hard disk drive read/write performance.

Figure 9A:
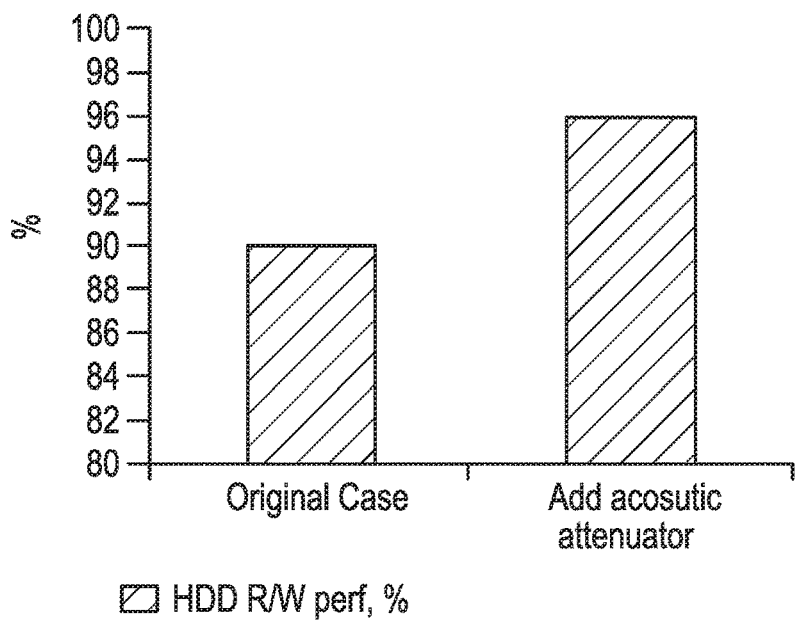
FIG. 9A is a chart exemplifying the hard disk drive read/write performance implementing an acoustic attenuator apparatus in the server device and without according to an embodiment.
Figure 9B:
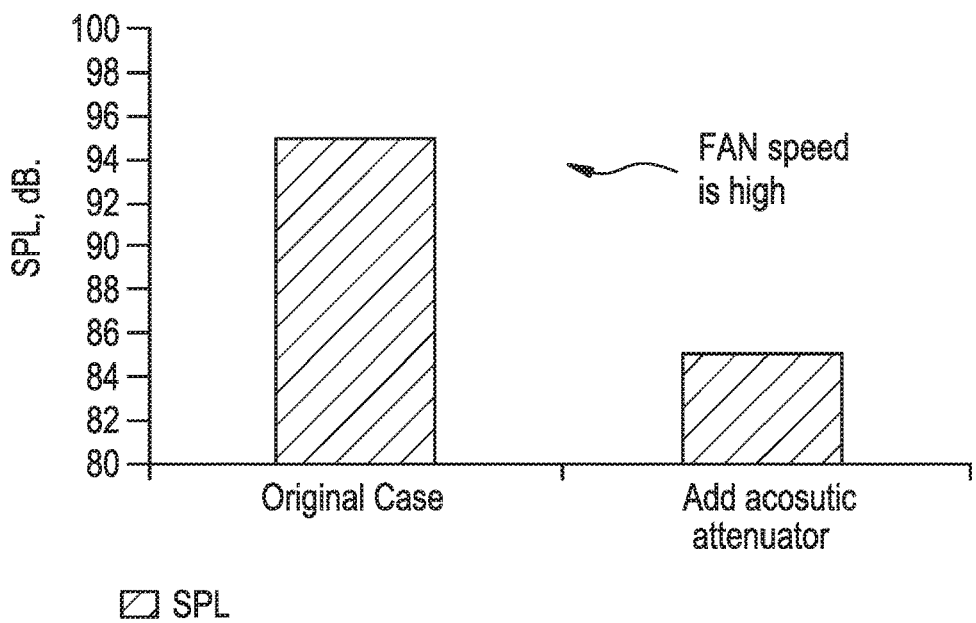
FIG. 9B is a chart exemplifying the sound pressure level (SPL) where an acoustic attenuator apparatus is implemented in the server device and without according to an embodiment.

In accordance with embodiments of the present invention, an acoustic attenuator apparatus is provided for reducing turbulence within the plenum of the outlet side 60 and the noise from the plurality of fan modules 250 and channeling the air away from the storage array module 200. Referring to FIGS. 9A and 9B momentarily, the addition of the acoustic attenuator apparatus improves the hard disk drive read/write performance and decreases the sound pressure level (SPL) around the storage array module 200.

Figure 3:
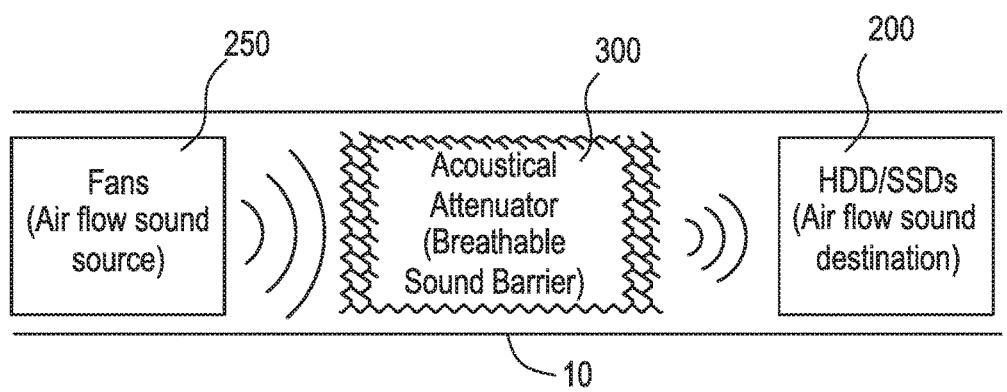
FIG. 3 shows a simplified block diagram of an acoustic attenuator apparatus in the system according to an embodiment.

FIG. 3 shows a simplified block diagram of an acoustic attenuator apparatus 300 in the server device 10. The acoustic attenuator apparatus 300 provides air flow guides so as to not disrupt the airflow 50 while providing a sound barrier to the plurality of fan modules 250 of the storage array module 200. As indicated above, a high-speed fan is introduced to remove the unnecessary heat produced by the server device 10. However, noise made by the high-speed fan is louder than that of a typical fan. As a result, the high-speed fan will generate high sound pressure level (SPL) and cause the HDD performance of reading/writing data to perform poorly. In light of these reasons, the optimization design for noise reducing and heat dissipating of the computer system is imperative. As explained below, the acoustic attenuator apparatus 300 provides sound reflection, diffraction and absorption to mitigate the noise of the plurality of fan modules 250.

Figure 4:
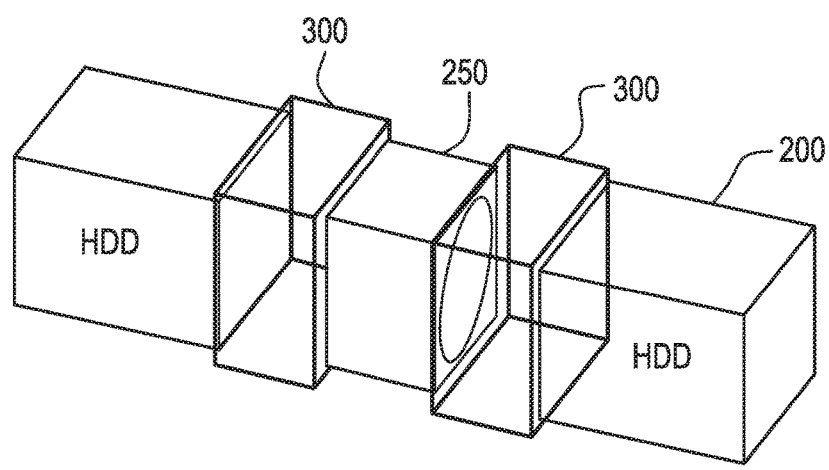
FIG. 4 is a top isometric view of a server device that includes a plurality of acoustic attenuator apparatuses according to an embodiment.

FIG. 4 is a top isometric view of a server device 10 that employs a plurality of acoustic attenuator apparatuses 300. In some embodiments, the server device 10 can orient the plurality of fan modules 250 between the storage array modules 200 to improve airflow 50 exhaust from the server device 10. In this case, the server device 10 can employ multiple acoustic attenuator apparatuses 300 to protect storage array modules 200 oriented on either side of the plurality of fan modules 250. Furthermore, the acoustic attenuator apparatus 300 can be positioned or relocated in various positions within the server device 10 to maximize performance of the storage array modules 200 and improve airflow 50 exhaust from the server device 10.

Figure 5:
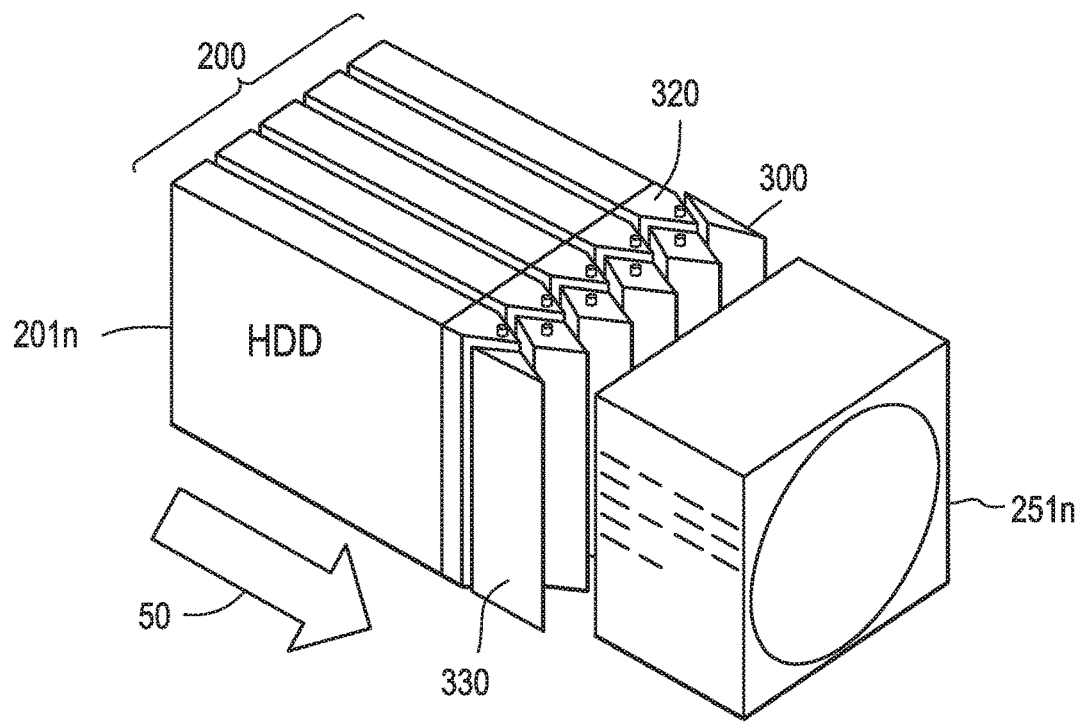
FIG. 5 is a top isometric view of an acoustic attenuator apparatus in the server device according to an embodiment.

FIG. 5 shows a top isometric view of an acoustic attenuator apparatus 300 in the server device 10. The acoustic attenuator apparatus 300 can include a plurality of flow guiding structures 320 and a plurality of flow separating structures 330. The acoustic attenuator apparatus 300 can be made of sound absorbing material. For example, the plurality of flow guiding structures 320 and plurality of flow separating structures 330 can be made from sound absorbing materials such as glass wool, urethane foam, and the like. Such materials are applicable as all or part of the materials of the plurality of flow guiding structures 320 and plurality of flow separating structures 330. It should be realized that the sound absorbers can be any material constructed to perform with high efficiency in regards to noise reduction. The materials mentioned above are only for example, and not to limit this disclosure. The person having ordinary knowledge in the art may flexibly select any material in accordance with the disclosure.

In some embodiments, each flow guiding structure 320 can be attached on the storage arrays 201n. This prevents airflow 50 from being undesirably directed or lost between the flow guiding structures 320 and the storage arrays 201n. As a result, the flow guiding structures 320 are closely stacked together in alignment with the storage arrays 201n. Each flow separating structure 330 can be spatially aligned and interleaved between each of the plurality of flow guiding structures 320. The space created in interleaving the flow guiding structures 320 and the flow separating structures 330 is the same size or smaller than the space 202 (FIGS. 2 and 6).

Figure 11:
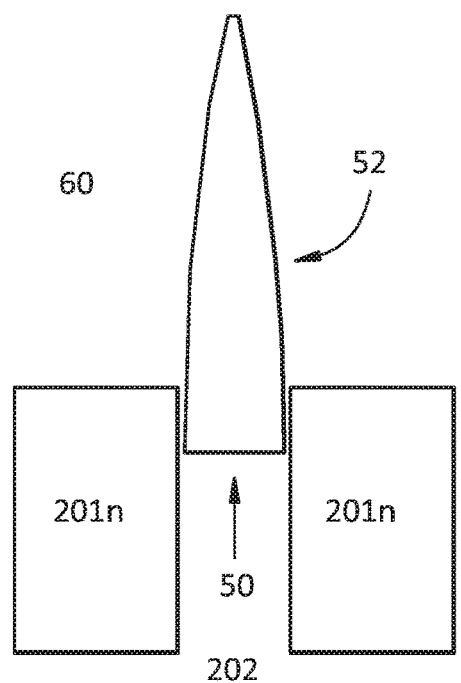
FIG. 11 shows a simplified block diagram of the turbulent flow where an acoustic attenuator apparatus is not implemented according to an embodiment.
Figure 12:
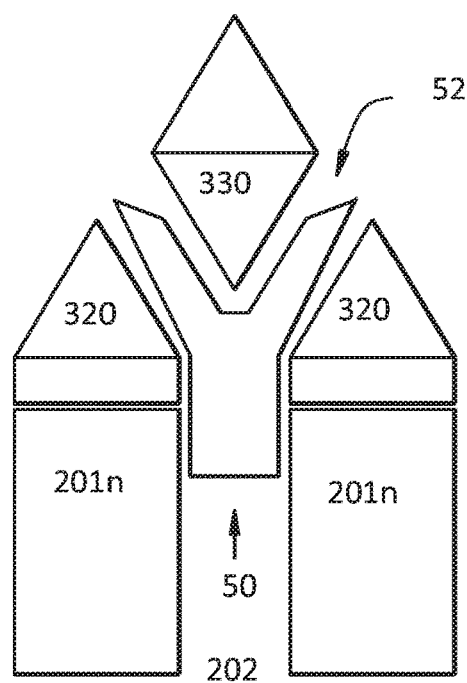
FIG. 12 shows a simplified block diagram of the blocked turbulent flow where an acoustic attenuator apparatus is implemented according to an embodiment.

Referring momentarily to FIGS. 11 and 12. As indicated in FIG. 11, when the airflow 50 exits the storage array module 200 into the plenum of the outlet side 60, the airflow 50 speed is decreased. The airflow 50 becomes turbulent flow 52 which contributes to the high sound pressure level (SPL) and diminished HDD performance of reading/writing data. For example, when the air flow 50 passes through the space 202 between the plurality of storage arrays 201n, it causes the turbulent flow 52 at the trailing edge of the plurality of storage arrays 201n.

As shown in FIG. 12, when the turbulent t flow 52 comes in contact with the flow separating structure 330, the turbulent flow 52 will be damaged, thereby reducing turbulence. Thus, maintaining or reducing the space created in interleaving the flow guiding structures 320 and the flow separating structures 330 prevents turbulence. Furthermore, maintaining or reducing the space created in interleaving the flow guiding structures 320 and the flow separating structures 330 prevents sound waves from the plurality of fan modules 250 from reaching the storage array module 200. The placement of the flow guiding structures 320 and the flow separating structures 330 are directly correlated with the sound wave length. Therefore, the dimension of the flow guiding structures 320 and the flow separating structures 330 can be adjusted for improved HDD reading/writing performance.

Figure 6:
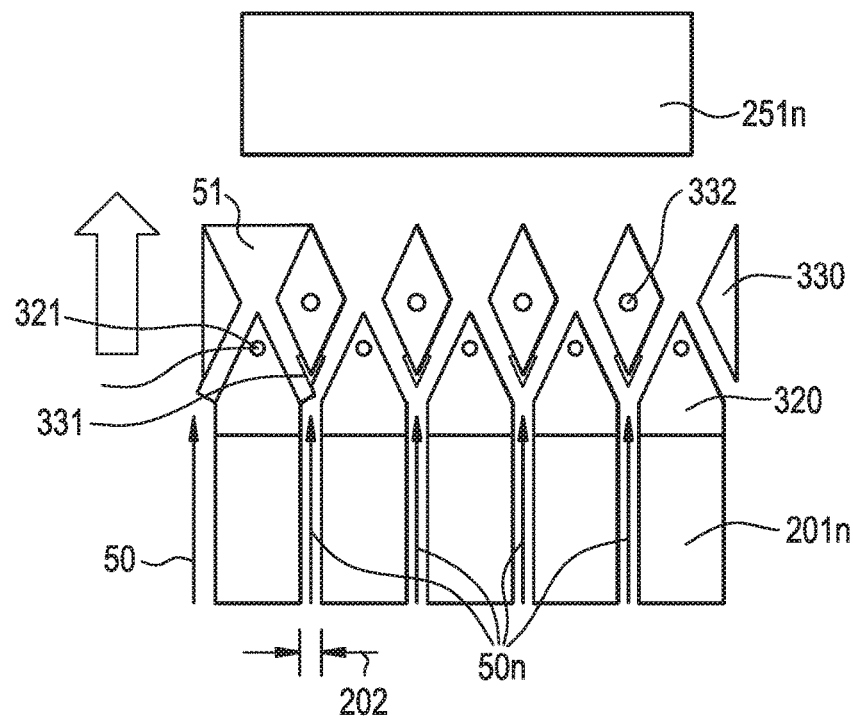
FIG. 6 shows a simplified block diagram of an acoustic attenuator apparatus according to an embodiment.

FIG. 6 a simplified block diagram of an acoustic attenuator apparatus 300. The flow guiding structures 320 can include a supporting feature 321 encased within the sound absorbing material. Similarly, the flow separating structures 330 can include a supporting feature 332 encased within the sound absorbing material. The supporting features 321, 332 can be secured to the base of the server device 10 to secure the flow guiding structures 320 and the flow separating structures 330 in place. The supporting features 321, 332 can be made of sheet metal using conventional metal fabrication techniques such as bending, forming, and stamping. Alternatively, the supporting features 321, 332 can be made of aluminum alloy, steel alloy, plastic materials, or any combination thereof. It should be realized that the supporting features 321, 332 can be made of any material constructed to withstand varying temperatures, fire proof, shock-vibration and airflow of high velocity. The materials mentioned above are only for example, and not to limit this disclosure. The person having ordinary knowledge in the art may flexibly select any material in accordance with the disclosure.

Figure 7:
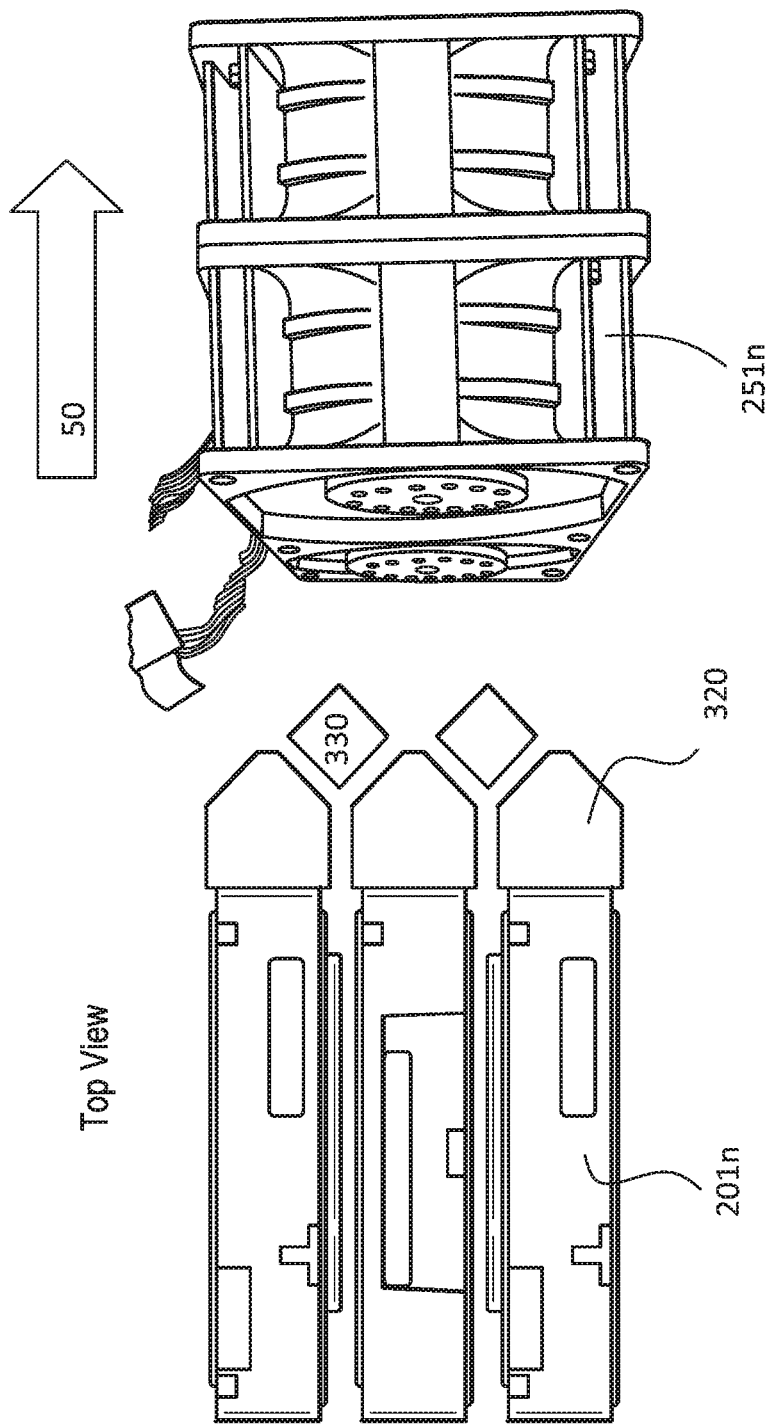
FIG. 7 is a top view of an acoustic attenuator apparatus in the server device according to an embodiment.
Figure 8:
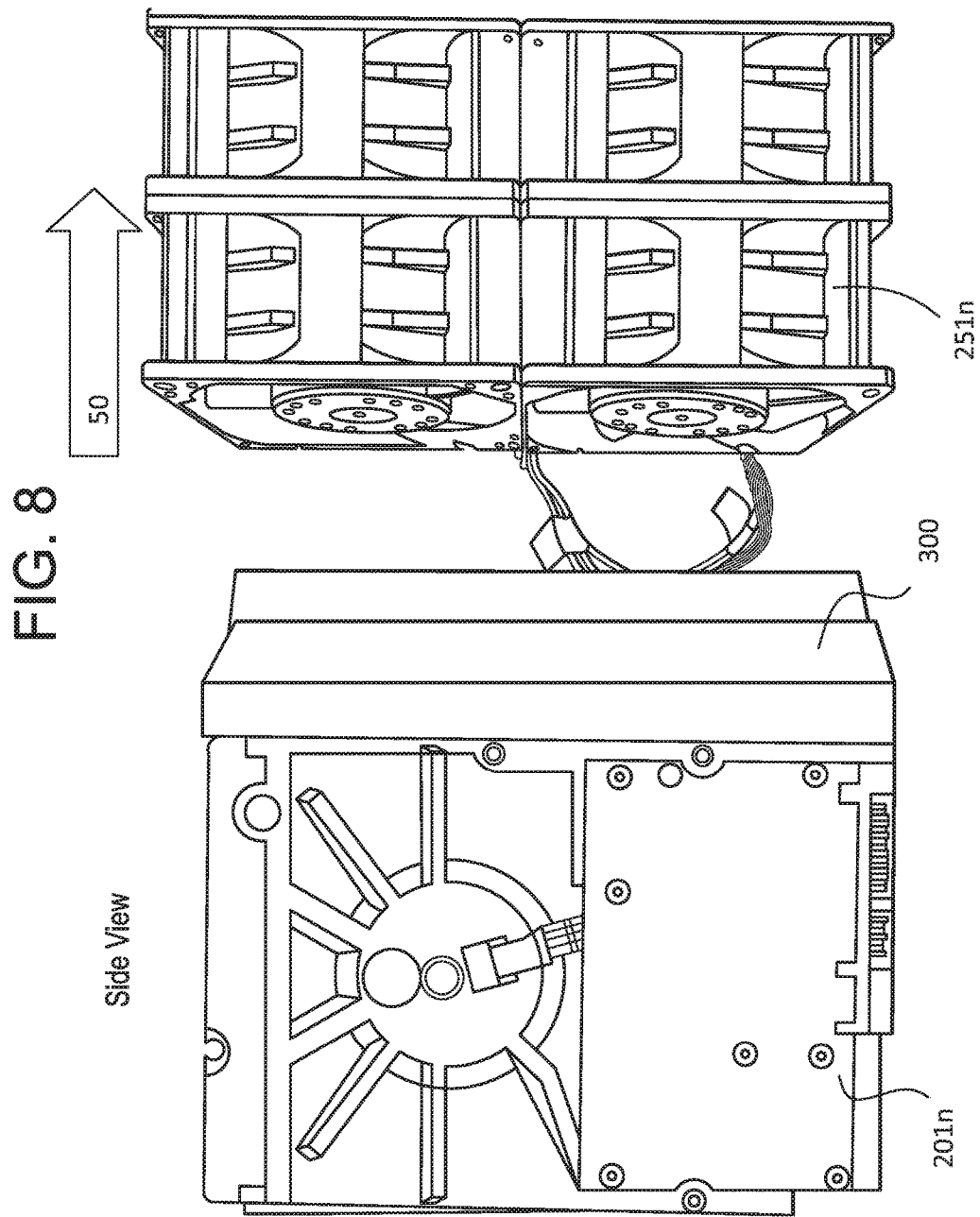
FIG. 8 is a side view of an acoustic attenuator apparatus in the server device according to an embodiment.

FIGS. 7 and 8 are top and side views, respectively, of the acoustic attenuator apparatus 300. The plurality of flow guiding structures 320 can be a fin with a trailing edge to guide the airflow 50 towards the plurality of flow separating structures 330. In regards to the trailing edge, a blunt edge reduces turbulence. This is because a blunt edge provides positive lift on the upper surface near the trailing edge, while a sharp edge has negative lift. As a result, the trailing edge can be sharp to encourage maximum airflow 50. In contrast, the trailing edge can be rounded to reduce turbulence and thus noise. In some embodiments, the plurality of flow guiding structures 320 can have a combination of rounded (blunt) trailing edges and sharp edges. The trailing edge of the flow guiding structures 320 can direct the airflow 50 towards an air flow guide 331 of the plurality of flow separating structures 330.

The plurality of flow separating structures 330 can be shaped like a fin with a leading edge as well as a trailing edge. The leading edge of the flow separating structures 330 includes an air flow guide 331. As indicated above the flow separating structures 330 is comprised of a sound absorbing material with a supporting feature 331 centered to position and maintain the flow separating structures 330. Sound absorbing materials are typically fragile material that can be deformed over time due to constant forces, such as high velocity winds. Therefore, the air flow guide 331 is provided to protect the leading edge of the flow separating structures 330. In some embodiments, the size of the flow guide 331 is sufficient to only cover the leading edge of the flow separating structures 330.

The leading edge and the trailing edge can be sharp to encourage maximum airflow 50 by reducing drag. In contrast, the trailing edge can be rounded to reduce turbulence and thus noise. In some embodiments, the plurality of flow separating structures 330 can have a combination of rounded (blunt) trailing edges and sharp edges. The trailing edge of flow separating structures 330 can direct the airflow 51 out of the server device 10 along an x-axis to the rear end 30 via the plurality of fan modules 250.

The air flow guide 331 can be made of sheet metal using conventional metal fabrication techniques such as bending, forming, and stamping. As a result, the air flow guide 331 can be made very inexpensively. Alternatively, the air flow guide 331 can be made of aluminum alloy, steel alloy, plastic materials, or any combination thereof. It should be realized that the air flow guide 331 can be made of any material constructed to withstand varying temperatures, fire proof, shock-vibration and airflow of high velocity. The materials mentioned above are only for example, and not to limit this disclosure. The person having ordinary knowledge in the art may flexibly select any material in accordance with the disclosure. The air flow guide 331 is used to split the airflow 50 at the flow separating structures 330 and guide the split airflow 50 along the sides of the flow separating structures 330 where the sound absorbers are exposed. The flow guide 331 is provided to protect the leading edge of the flow separating structures 330.

Referring to FIG. 6. Once the airflow 50 passes between the flow guiding structures 320 to the flow separating structures 330 the airflow 50 is divided and recombined with airflow 50n from an adjoining space 202 to form airflow 51. Airflow 51 exits the acoustic attenuator apparatus 300 into the plenum of the outlet side 60, to the plurality of fan modules 250 to be exhausted towards the rear end 30.

The acoustic attenuator apparatus 300 provides air flow guides so as to not disrupt the airflow 50 while providing a sound barrier to the plurality of fan modules 250 of the storage array module 200. Every time a sound wave collides with the sound absorbers of the acoustic attenuator apparatus 300, the sound wave is absorbed and attenuated. This contributes to reduction in noise from the server device 10.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

The terminology used herein is for the purpose of describing particular embodiments only and is not intended to be limiting of the invention. As used herein, the singular forms "a", "an" and "the" are intended to include the plural forms as well, unless the context clearly indicates otherwise. Furthermore, to the extent that the terms "including", "includes", "having", "has", "with", or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The invention claimed is:

1. An apparatus comprising:
a plurality of flow guiding structures spatially aligned in a first row, each of the plurality of flow guiding structures comprising a fin to funnel airflow at a trailing edge of each of the plurality of flow guiding structures; and
a plurality of flow separating structures spatially aligned in a second row partially interleaved between each of the plurality of flow guiding structures, each of the plurality of flow separating structures comprising a fin configured to split airflow received from the plurality of flow guiding structures, wherein a leading edge of each of the plurality of flow separating structure is aligned with a midpoint of a distance between two adjacent storage arrays.

2. The apparatus of claim 1, wherein each of the plurality of flow separating structures comprises a supporting rod encased by a sound absorber material.

3. The apparatus of claim 1, wherein each of the plurality of flow guiding structures comprises a supporting rod encased by a sound absorber material.

4. The apparatus of claim 1, wherein the fin of each of the plurality of flow separating structures comprises a rounded leading edge and a sharp trailing edge.

5. The apparatus of claim 4, wherein the rounded leading edge comprises a supporting feature.

6. The apparatus of claim 1, wherein the trailing edge of each of the plurality of flow guiding structures comprises a sharp trailing edge.

7. The apparatus of claim 1, wherein the trailing edge of each of the plurality of flow guiding structures comprises a rounded trailing edge.

8. A computing device comprising:
a housing having an inlet side, an outlet side, a first sidewall, and a second sidewall, the first sidewall and the second sidewall extending from the inlet side to the outlet side;
at least one row of drive bays extending at least partially from the first sidewall to the second sidewall, the at least one row of drive bays configured to receive a plurality of hard disk drives and to provide a plurality of gaps between the plurality of hard disk drives;
a plurality of flow guiding structures disposed between the at least one row of drive bays and the outlet side, wherein:
each of the plurality of flow guiding structures is directly coupled to a corresponding one of the plurality of hard disk drives, and
each of the plurality of flow guiding structures comprises a fin to funnel airflow through the plurality of gaps between the plurality of hard disk drives to a trailing edge; and
a plurality of flow separating structures interleaved between each of the plurality of flow guiding structures, each of the plurality of flow separating structures comprising a fin configured to split airflow received from the plurality of flow guiding structures.

9. The computing device of claim 8, wherein each of the plurality of flow separating structures comprises a supporting rod encased by a sound absorber material.

10. The computing device of claim 8, wherein each of the plurality of flow guiding structures comprises a supporting rod encased by a sound absorber material.

11. The computing device of claim 8, wherein the fin of each of the plurality of flow separating structures comprises a rounded leading edge and a sharp trailing edge.

12. The computing device of claim 11, wherein the rounded leading edge comprises a supporting feature.

13. The computing device of claim 8, wherein the trailing edge of each of the plurality of flow guiding structures comprises a sharp trailing edge.

14. The computing device of claim 8, wherein the trailing edge of each of the plurality of flow guiding structures comprises a rounded trailing edge.

15. A storage array module, comprising:
a plurality of storage arrays;
a plurality of flow guiding structures spatially aligned in a first row, each of the plurality of flow guiding structures comprising a fin to funnel airflow at a trailing edge of each of the plurality of flow guiding structures, wherein each of the plurality of flow guiding structures is configured to directly couple to a corresponding one of the plurality of storage arrays; and
a plurality of flow separating structures spatially aligned in a second row partially interleaved between each of the plurality of flow guiding structures, each of the plurality of flow separating structures comprising a fin configured to split airflow received from the plurality of flow guiding structures.

16. The storage array module of claim 15, wherein a leading edge of each of the plurality of flow separating structure is aligned with a midpoint of a distance between two adjacent storage arrays of the plurality of storage arrays.

17. The storage array module of claim 15, wherein the fin of each of the plurality of flow separating structures comprises a rounded leading edge and a sharp trailing edge.

18. The storage array module of claim 17, wherein the rounded leading edge comprises a supporting feature.

19. The storage array module of claim 15, wherein the trailing edge of each of the plurality of flow guiding structures comprises a sharp trailing edge.

20. The storage array module of claim 15, wherein the trailing edge of each of the plurality of flow guiding structures comprises a rounded trailing edge.

* * * * *